US006026928A

United States Patent [19]

[11] Patent Number: 6,026,928

[45] Date of Patent: Feb. 22, 2000

Maharaj

[54] APPARATUS AND METHOD FOR REDUCED DISTORTION LOUDSPEAKERS

[76] Inventor: Ashok A. Maharaj, Apartado, 1339, Maracaibo, Venezuela

[21] Appl. No.: 09/286,675

[22] Filed: Apr. 6, 1999

[51] Int. Cl.[7] .................... H05K 5/00

[52] U.S. Cl. .................... 181/152; 181/185; 381/343

[58] Field of Search .................... 181/152, 177, 181/180, 182, 185, 191, 192, 195, 151; 381/340, 341, 342, 343

[56] References Cited

U.S. PATENT DOCUMENTS

| | | | |
|---|---|---|---|
| 2,037,185 | 4/1936 | Thuras . | |
| 2,037,187 | 4/1936 | Wente . | |
| 2,183,528 | 12/1939 | Blackburn . | |
| 2,808,895 | 10/1957 | Chave | 181/152 |
| 3,016,430 | 1/1962 | Hoodwin | 181/152 |
| 3,866,710 | 2/1975 | Cesati . | |
| 4,152,552 | 5/1979 | Meyer . | |
| 4,181,193 | 1/1980 | Isaac . | |
| 4,225,010 | 9/1980 | Smith . | |
| 4,325,456 | 4/1982 | Ureda . | |
| 4,718,517 | 1/1988 | Carlson . | |
| 4,776,428 | 10/1988 | Belisle . | |
| 4,975,965 | 12/1990 | Adamson . | |

*Primary Examiner*—Khanh Dang
*Attorney, Agent, or Firm*—Alvin S. Blum

[57] ABSTRACT

Method and apparatus applied to loudspeakers of the type having an electrically driven diaphragm in an acoustic housing to reduce distortion from two sources. 1. Loss of high frequencies when sound from different regions of the diaphragm travel paths of different lengths and neutralize each other when they meet out of phase. 2. Noise generated primarily by the central region of the diaphragm when driven at high power. A compensating or phase plug is suspended axially within the housing adjacent the central region of the diaphragm. The plug, in cooperation with the walls of the housing, directs the sound through paths of uniform length to reduce loss of high frequencies. The plug has a sound absorbing inner portion adjacent the central portion of the diaphragm for absorbing the noise generated by the central portion at high power.

8 Claims, 2 Drawing Sheets

APPARATUS AND METHOD FOR REDUCED DISTORTION LOUDSPEAKERS

BACKGROUND OF THE INVENTION

1. Field of the Invention

This invention relates to apparatus and methods for reducing distortion in loudspeakers by specially constructed phase plugs.

2. Description of the Prior Art

When the diaphragms of loudspeakers are driven for high volume output, there is not only a tendency to lose more of the higher frequency sounds, but also to introduce noise as well. When waves from different regions of the diaphragm reach a common point, such as the open mouth of a horn, at different times, a high pressure wave phase will be neutralized by a low pressure wave phase from another region. This effect is more pronounced as the frequency increases. The net result is a loss of fidelity at the high end of the bandpass.

Wente in U.S. Pat. No. 2,037,187 taught a multisection transducer or phase plug comprising a family of nested concentric cones that forms a plurality of converging sound ducts of equal length. This causes sound originating in all areas of the diaphragm to reach a common point at the same time to overcome this phase distortion. Since then, phase plugs have been shown with a variety of configurations. Levy in U.S. Pat. No. 2,858,377 shows converging holes. Blackburn in U.S. Pat. No. 2,183,528 shows slots. Belisle in U.S. Pat. No. 4,776,428 shows vanes. Smith in U.S. Pat. No. 4,225,010 discusses distortion contributed by the central region of the diaphragm and teaches a damper pad positioned away from the diaphragm.

SUMMARY OF THE INVENTION

Applicant has found that, in addition to the distortion due to high frequency loss through phase differences, there are many noise signals and other distortions in the sound output that are more pronounced when large speakers are driven at high volume output. Applicant has found that these distortions originate primarily at the central portion of the diaphragm. It would be desirable to provide a loudspeaker that had reduced distortion from both of these phenomena It is accordingly an object of the invention to provide a method and apparatus for reducing distortions in a loudspeaker that are caused by sound originating in different regions arriving at a common point at different times, and also from noise and other distortions that originate from the central region of the diaphragm.

The apparatus of the invention comprises a phase plug, or compensation plug, closely approximating the diaphragm. The phase plug of the invention provides sound ducts of uniform length extending to a common region, such as the mouth of a horn, in a manner well known in the prior art. The phase plug of the invention further provides another function not known in the prior art. The central portion of the plug facing the diaphragm is provided with means for absorbing sound impinging thereon. This absorbing portion is closely applied to the central portion of the diaphragm to thereby remove the unwanted distortions emanating therefrom. It is spaced apart from the diaphragm far enough so that there will not be contact at maximum drive amplitude. The nature and type of absorber or absorbers in the plug will be adjusted to the physical requirements of a particular loudspeaker for optimum results. Although this results in some loss of sound volume, it is only a small fraction of the total volume because the central area of the diaphragm is only a small fraction of the total diaphragm area.

These and other objects, features and advantages of the invention will become more apparent when the detailed description is studied in conjunction with the drawings, in which like reference characters indicate like elements in the various drawing figures.

DETAILED DESCRIPTION OF PREFERRED EMBODIMENTS

Figure 1:
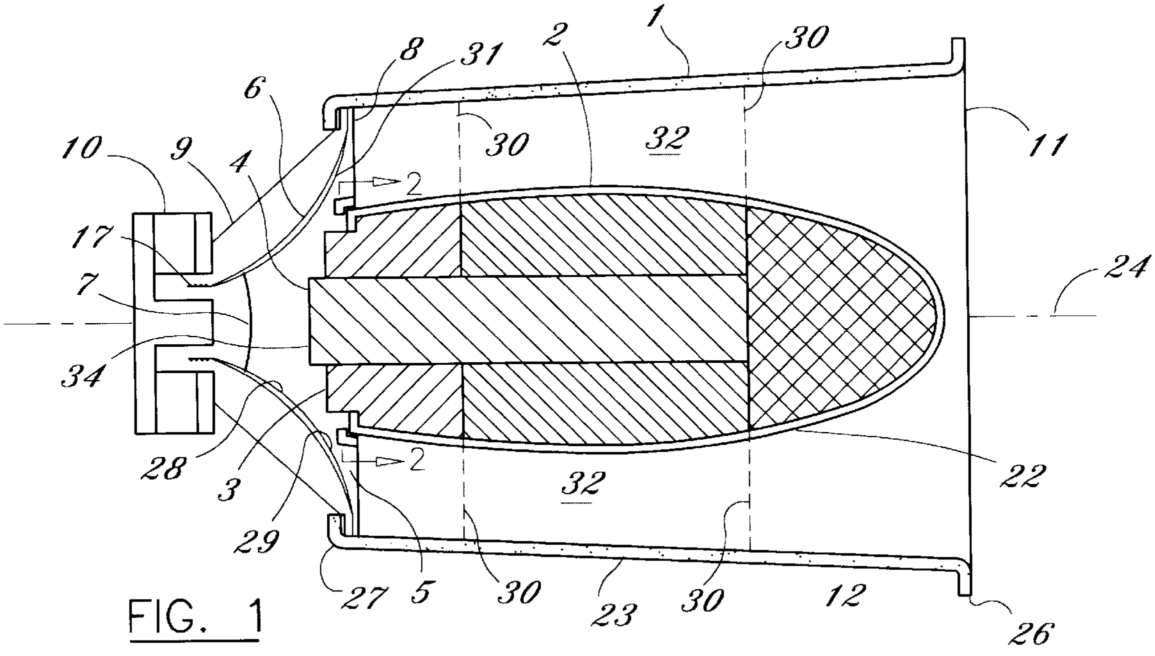
FIG. 1 is a longitudinal cross sectional view of a horn loudspeaker of the invention with a cone type diaphragm.
Figure 2:
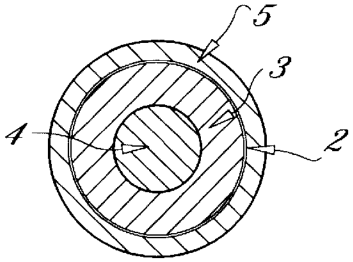
FIG. 2 is a sectional view of the compensation plug taken through line 2—2 of FIG. 1.

Referring now to FIGS. 1 and 2, a horn type loudspeaker has a housing 1 defining a sound chamber 12. The housing has tapering side walls 23 around a central axis 24, an open mouth 11 at a wider first end 26 of the housing directed at the audience and a narrower second end 27. The second end is closed by a cone diaphragm 6 with a center cap 7 caused to vibrate by voice coil assembly 17 in a magnetic circuit 10, with loudspeaker frame 9 and frame rim 8 of conventional construction.

The diaphragm 6 has a front surface 31 with a central region 28 and a peripheral region 29 surrounding the central region from which sound emanates to the chamber 12. Sound emanating from the central region has a high noise content that this apparatus suppresses by means of a compensation plug 22.

A compensation plug member 22 is suspended axially within the sound chamber, as indicated diagrammatically by phantom lines 30 connected to the side walls. The compensation plug 22 has a rigid outer shell 2 that acts in cooperation with side walls 23 to form an annular acoustic path 32 through which all of the sound must pass. The inner face 34 of the plug is positioned closely approximating the central region 28 of the diaphragm. It is provided with sound absorbing features that absorb sound emanating from the central region 28. These sound absorbing features may take a variety of forms such as, for example, a resonant cavity (not shown), or damping materials 3,4 of various densities and resilience as determined by the unique physical features of a particular loudspeaker. A narrow ring 5 of absorbent material may optionally be mounted on the perimeter of inner face 34 as required.

Figure 4:
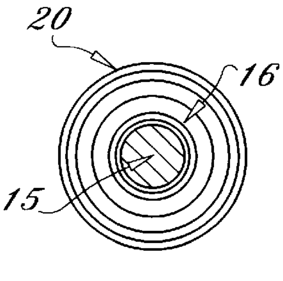
FIG. 4 is a cross sectional view of the compensation plug taken on line 4—4 of FIG. 3.
Figure 3:
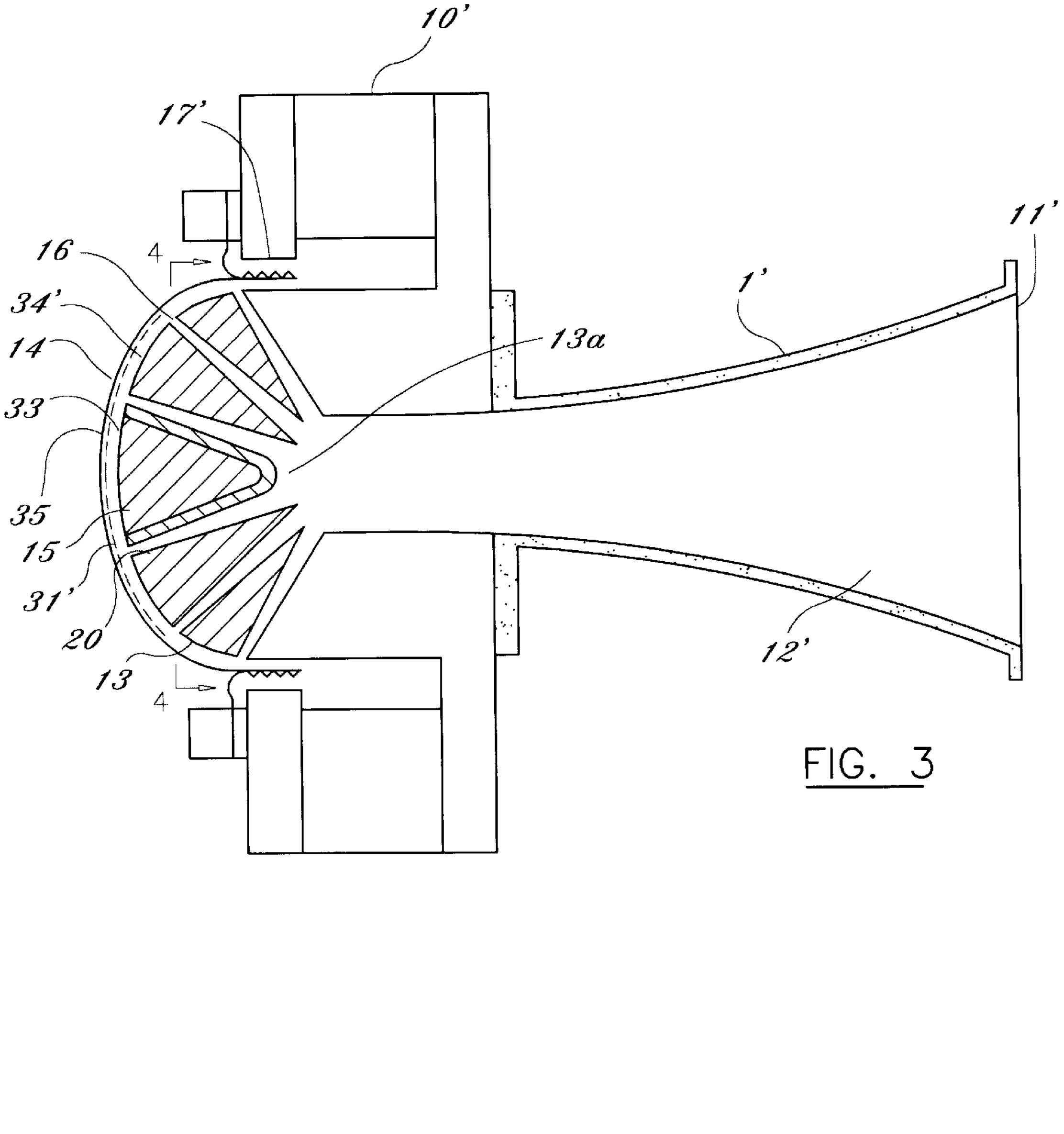
FIG. 3 is a longitudinal cross sectional view of a horn loudspeaker of the invention with a compression type diaphragm.

Referring now to FIGS. 3 and 4, another loudspeaker 1' of the invention is shown with a compression driver type diaphragm 14 caused to vibrate by voice coil assembly 17' in magnetic circuit 10' to cause sound to pass through acoustic chamber 12' to mouth 11'.

A compensation plug 20 suspended along the axis of the chamber has an inner face 34' closely conforming to the front surface 31' of the diaphragm, but spaced apart therefrom sufficiently to permit unrestricted movement of the diaphragm at full power. The plug is made up of many concentric conical elements 13 that are nested together to form multiple converging annular acoustic paths 16 in the manner described by Wente to cause sound emanating from various regions of the diaphragm to meet at a common point in phase to avoid loss of high frequencies.

A central member 13*a* has rigid sides except on the surface 33 that is adjacent the central region 35 of the diaphragm 14. This surface 33 is a sound absorbing surface. It may be the front end of a hollow resonant chamber or one or more sound absorbing materials 15.

Figure 5:
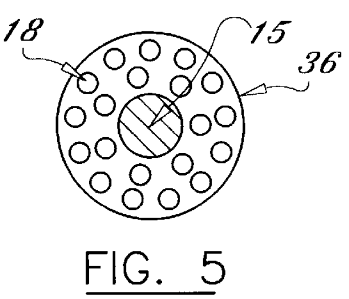
FIG. 5 is a sectional view, as in FIG. 4, of another embodiment of the compensation plug having converging holes.

In the alternative embodiment of a compensating plug 36 of FIG. 5, converging holes 18 form multiple acoustic paths of equal length for phase compensation.

Figure 6:
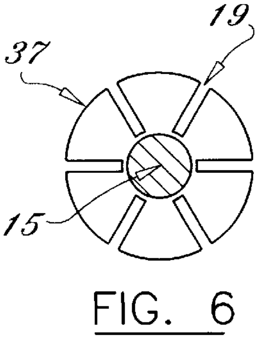
FIG. 6 is a sectional view, as in FIG. 4, of another embodiment of the compensation plug having radial converging slits.

In the alternative embodiment of plug 37 shown in FIG. 6, radial converging slots 19 form acoustic paths for phase compensation. Both plugs 36 and 37 of FIGS. 5 and 6 provide a sound absorbing central member 15 as described supra.

The above disclosed invention has a number of particular features which should preferably be employed in combination, although each is useful separately without departure from the scope of the invention. While I have shown and described the preferred embodiments of my invention, it will be understood that the invention may be embodied otherwise than herein specifically illustrated or described, and that certain changes in form and arrangement of parts and the specific manner of practicing the invention may be made within the underlying idea or principles of the invention.

What is claimed is:

1. A loudspeaker comprising:

a housing defining a sound chamber having side walls, a central axis, an open mouth for emitting sound therefrom at a first end of said axis, and an opposed second end of said axis;

an electrically driven diaphragm contained within said housing adjacent said second end, the diaphragm having a front surface facing said mouth, a central region, and a peripheral region adjacent to, and surrounding, said central region; and compensation plug means suspended axially within said chamber for selectively absorbing sound emanating from said central region, and also for defining, in cooperation with said side walls, at least one acoustic path causing sound waves generated by different areas of said front surface to be emitted from said mouth substantially in phase, said compensation plug means having an inner face provided with sound absorbing means, said inner face being closely approximated to said central region, other faces of said compensation plug means provided with rigid surfaces.

2. The loudspeaker according to claim 1, in which said diaphragm is of the cone type.

3. The loudspeaker according to claim 1, in which said diaphragm is of the compression type.

4. The loudspeaker according to claim 3, in which said compensation plug means further comprises a plurality of annular acoustic sound paths formed by a plurality of nested, tapered cones.

5. The loudspeaker according to claim 3, in which said compensation plug means further comprises a plurality of tapered convergent acoustic paths defined by tapered holes in said plug means.

6. The loudspeaker according to claim 3, in which said compensation plug means further comprises a plurality of convergent acoustic paths defined by radial slots in compensation plug means.

7. The loudspeaker according to claim 1, in which said sound absorbing means is adjustable to compensate for physical characteristics of a particular loudspeaker.

8. In a loudspeaker having a housing defining a sound chamber having side walls, a central axis, an open mouth for emitting sound therefrom at a first end of said axis, and an opposed second end of said axis, an electrically driven diaphragm contained within said housing adjacent said second end, the diaphragm having a front surface facing said mouth, a central region, and a peripheral region adjacent to, and surrounding, said central region, a method for reducing distortion comprising:

suspending a compensation plug means axially within said chamber for selectively absorbing sound emanating from said central region, and also for defining, in cooperation with said side walls, at least one acoustic path causing sound waves generated by different areas of said front surface to be emitted from said mouth substantially in phase, said compensation plug means having an inner face provided with sound absorbing means; and closely approximating said inner face to said central region, while providing other faces of said compensation plug means with rigid surfaces.

* * * * *